United States Patent
Lee et al.

(10) Patent No.: US 10,734,324 B2
(45) Date of Patent: Aug. 4, 2020

(54) FAN-OUT SEMICONDUCTOR PACKAGE INCLUDING STACKED CHIPS

(71) Applicant: SAMSUNG ELECTRO-MECHANICS CO., LTD., Suwon-si, Gyeonggi-do (KR)

(72) Inventors: Yun Tae Lee, Suwon-Si (KR); Eun Jung Jo, Suwon-Si (KR); Han Kim, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/171,114

(22) Filed: Oct. 25, 2018

(65) Prior Publication Data

US 2019/0326223 A1    Oct. 24, 2019

(30) Foreign Application Priority Data

Apr. 18, 2018    (KR) .................... 10-2018-0045020

(51) Int. Cl.
*H01L 23/538*    (2006.01)
*H01L 23/31*    (2006.01)
(Continued)

(52) U.S. Cl.
CPC ...... *H01L 23/5389* (2013.01); *H01L 23/3107* (2013.01); *H01L 23/5383* (2013.01);
(Continued)

(58) Field of Classification Search
CPC combination set(s) only.
See application file for complete search history.

(56) References Cited

U.S. PATENT DOCUMENTS 8,354,304 B2    1/2013 Chow et al.
2015/0311185 A1    10/2015 Ng et al.
(Continued)

FOREIGN PATENT DOCUMENTS

KR    10-2018-0011445 A    2/2018
KR    10-2018-0029483 A    3/2018
(Continued)

OTHER PUBLICATIONS

Office Action issued in Korean Patent Application No. 10-2018-0045020 dated May 21, 2019, with English translation.
(Continued)

*Primary Examiner* — Daniel Whalen
(74) *Attorney, Agent, or Firm* — Morgan, Lewis & Bockius LLP

(57) ABSTRACT

A fan-out semiconductor package includes a core member having a first through-hole and including wiring layers; a first semiconductor chip disposed in the first through-hole and having first connection pads formed on a lower side of the first semiconductor chip; a first encapsulant covering the core member and the first semiconductor chip; a connection member disposed below the core member and the first semiconductor chip and including redistribution layers; a first stack chip disposed on the first encapsulant and electrically connected to the wiring layers through a first connection conductor; and a second encapsulant disposed on the first encapsulant and covering the first stack chip. The first semiconductor chip includes DRAM and/or a controller, the first stack chip includes a stack type NAND flash, and the first connection pads of the first semiconductor chip are electrically connected to the wiring layers through the redistribution layers.

10 Claims, 11 Drawing Sheets

(51) Int. Cl.
*H01L 23/00* (2006.01)
*H01L 25/18* (2006.01)
*H01L 25/065* (2006.01)

(52) U.S. Cl.
CPC .......... *H01L 23/5386* (2013.01); *H01L 24/20* (2013.01); *H01L 25/0652* (2013.01); *H01L 25/18* (2013.01); *H01L 2224/214* (2013.01); *H01L 2225/06506* (2013.01); *H01L 2225/06562* (2013.01); *H01L 2225/06582* (2013.01); *H01L 2924/1431* (2013.01); *H01L 2924/1436* (2013.01); *H01L 2924/14511* (2013.01)

(56) References Cited

U.S. PATENT DOCUMENTS

| | | |
|---|---|---|
| 2016/0148918 A1 | 5/2016 | Ye et al. |
| 2016/0276311 A1 | 9/2016 | Meyer et al. |
| 2017/0287839 A1* | 10/2017 | Lee ................... H01L 23/5384 |
| 2018/0026022 A1* | 1/2018 | Lee ................... H01L 21/561 |
| | | 257/659 |
| 2018/0033782 A1* | 2/2018 | Jeng .................. H01L 25/50 |
| 2018/0076178 A1 | 3/2018 | Park et al. |

FOREIGN PATENT DOCUMENTS

| | | |
|---|---|---|
| TW | 201434132 A | 9/2014 |
| TW | 201603211 A | 1/2016 |
| TW | M537303 U | 2/2017 |
| TW | M537304 U | 2/2017 |
| TW | 201717339 A | 5/2017 |
| TW | 201807792 A | 3/2018 |
| TW | 201813031 A | 4/2018 |
| WO | 2017209724 A1 | 12/2007 |
| WO | 2014/131152 A1 | 9/2014 |

OTHER PUBLICATIONS

Taiwanese Office Action dated Oct. 17, 2019 issued in Taiwanese Patent Application No. 107138245 (with English translation).
Taiwanese Office Action dated Dec. 23, 2019 issued in Taiwanese Patent Application No. 107138245 (with English translation).

* cited by examiner

FAN-OUT SEMICONDUCTOR PACKAGE INCLUDING STACKED CHIPS

CROSS-REFERENCE TO RELATED APPLICATION(S)

This application claims benefit of priority to Korean Patent Application No. 10-2018-0045020 filed on Apr. 18, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A solid state drive (SSD) is a device that stores information using NAND Flash memory, is faster than a hard disk drive (HDD) and may be reduced in size and weight with a lower failure rate, less heat generation and less noise. In recent years, as SSD capacity has increases, SSD have replaced or supplemented HDD, and have been applied to netbooks and tablets.

Meanwhile, a size of a semiconductor chip is being continuously reduced in accordance with the application requirements of such a small-sized product, and one of the semiconductor package technologies proposed for the connection of electrical signals when forming a semiconductor package is a fan-out package. In the case of the conventional package on package (POP) type package structure to which the fan-out package is applied, a lower package and an upper package are manufactured separately to form a full package, and in this case, a thickness of the product is considerable and signal loss may further occur.

SUMMARY

An aspect of the present disclosure may provide a fan-out semiconductor package capable of simultaneously performing various functions, being thinned, and having low signal loss.

An aspect of the present disclosure may directly mount a stack type NAND flash on a lower package in which DRAM and/or a controller are packaged and connect the NAND flash to wiring layers of a core member and redistribution layers of a connection member of the lower package using connection conductors to thereby perform redistribution.

According to an aspect of the present disclosure, a fan-out semiconductor package may include a core member having a first through-hole and including one or more wiring layers; a first semiconductor chip disposed in the first through-hole and having first connection pads formed on a lower side of the first semiconductor chip; a first encapsulant covering at least portions of the core member and the first semiconductor chip; a connection member disposed below the core member and the first semiconductor chip and including one or more redistribution layers; a first stack chip disposed on the first encapsulant and electrically connected to the one or more wiring layers of the core member through a first connection conductor; and a second encapsulant disposed on the first encapsulant and covering at least a portion of the first stack chip. The first semiconductor chip may include at least one of DRAM and a controller, the first stack chip may include a stack type NAND flash, and the first connection pads of the first semiconductor chip may be electrically connected to the one or more wiring layers of the core member through the one or more redistribution layers of the connection member.

According to another aspect of the present disclosure, a fan-out semiconductor package may include a core member having a first through-hole and a second through-hole, spaced apart from each other and including one or more wiring layers; a first semiconductor chip disposed in the first through-hole and having first connection pads formed on a lower side of the first semiconductor chip; a second semiconductor chip disposed in the second through-hole and having second connection pads formed on a lower side of the second semiconductor chip; a first encapsulant covering at least portions of the core member, the first semiconductor chip, and the second semiconductor chip; a connection member disposed below the core member, the first semiconductor chip, and the second semiconductor chip and including one or more redistribution layers; a first stack chip disposed on the first encapsulant and electrically connected to the one or more wiring layers of the core member through a first connection conductor; a second stack chip disposed on the first encapsulant and electrically connected to the one or more wiring layers of the core member through a second connection conductor; and a second encapsulant disposed on the first encapsulant and covering at least portions of the first stack chip and the second stack chip. The first connection pads and the second connection pads may be electrically connected to the one or more wiring layers of the core member through the one or more redistribution layers of the connection member, respectively.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
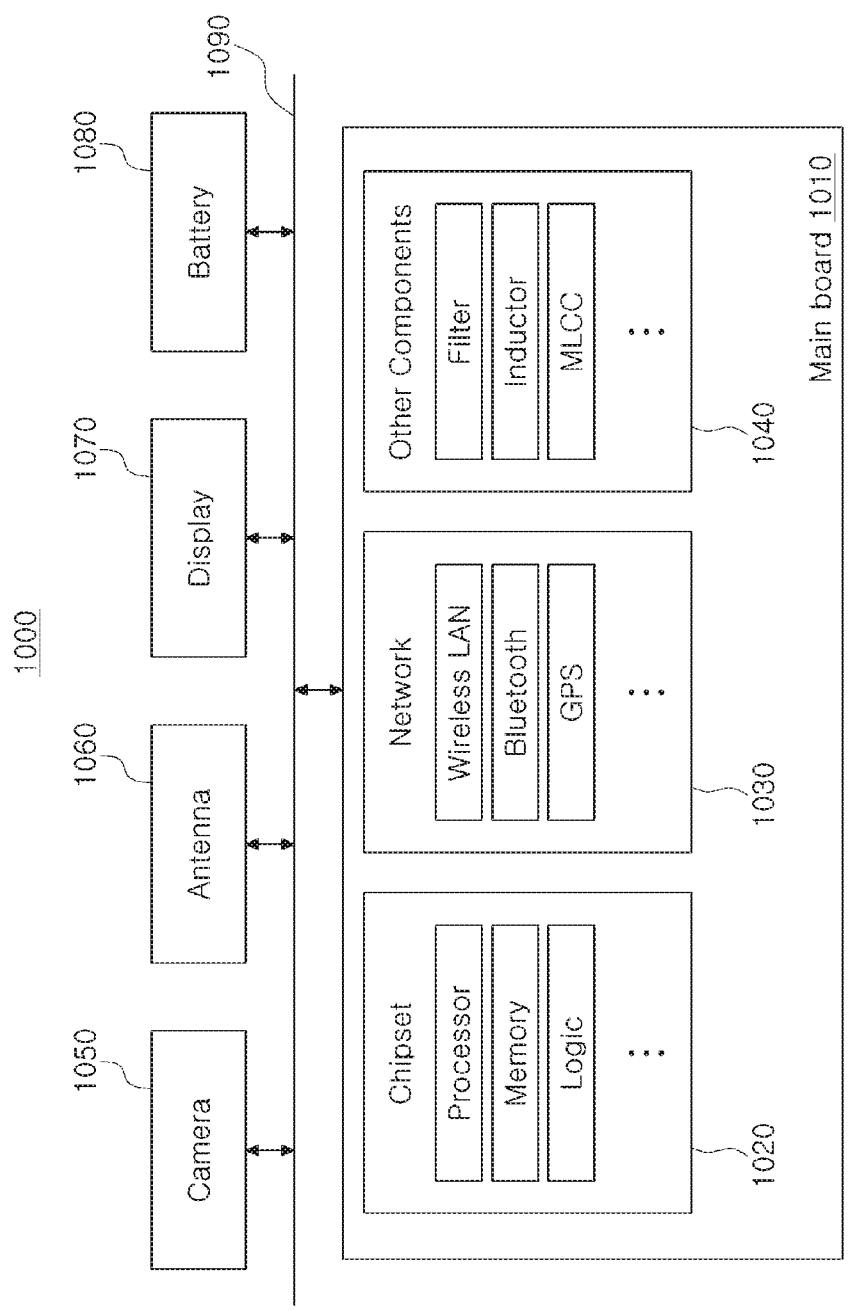
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically and/or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
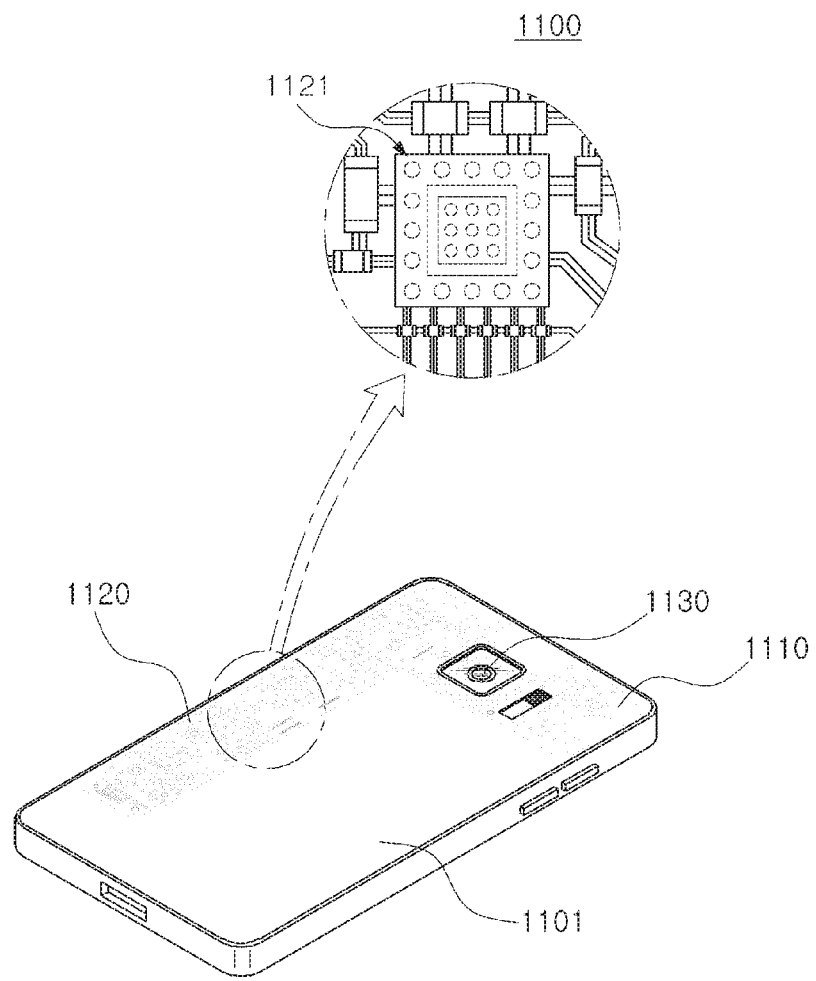
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mother board 1110 may be accommodated in a body 1101 of a smartphone 1100, and various components 1120 may be physically or electrically connected to the mother board 1110. In addition, other components that may or may not be physically and/or electrically connected to the mother board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figures 3A, 3B:
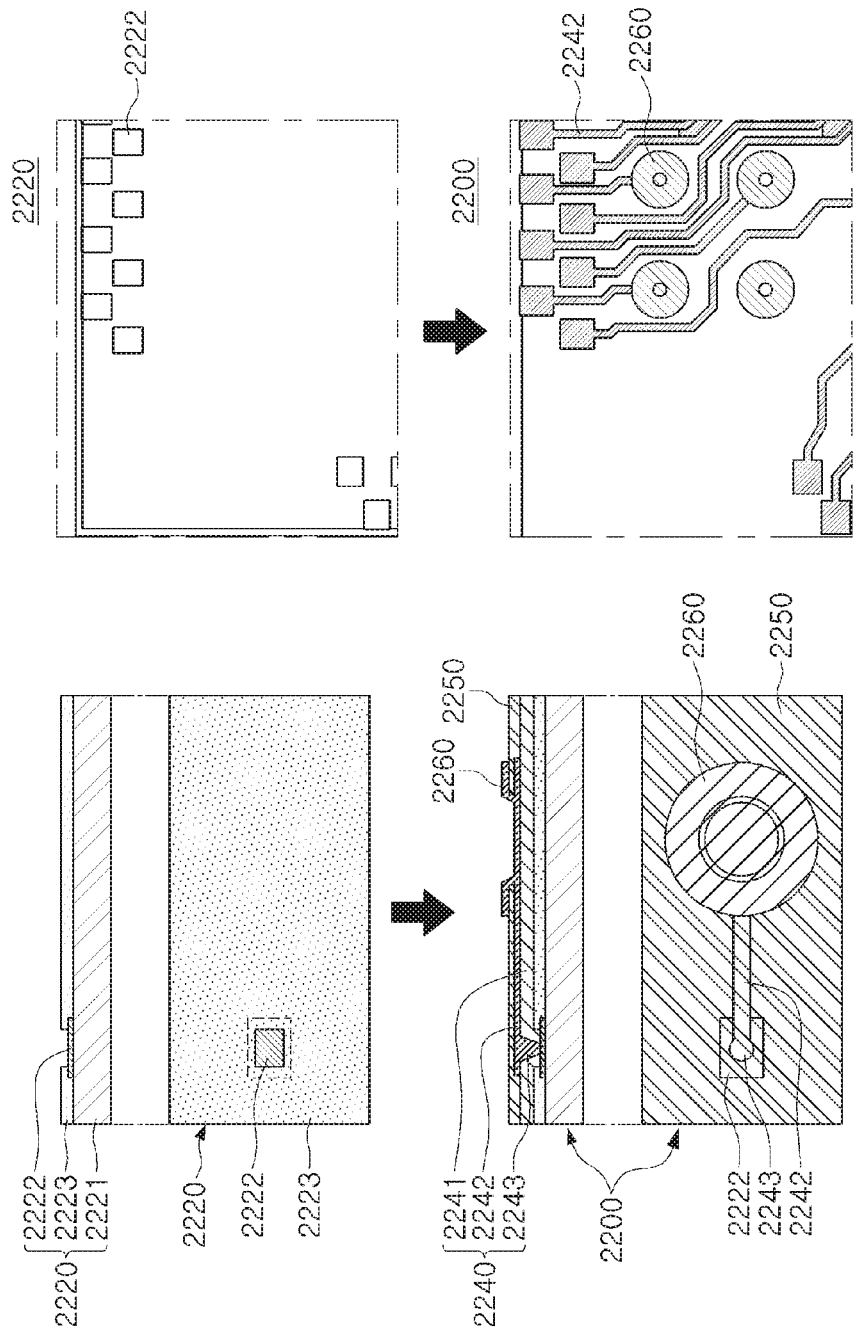
FIG. 3A and FIG. 3B are schematic cross-sectional views illustrating states of a fan-in semiconductor package before and after being packaged.

FIG. 3 is a schematic cross-sectional view illustrating states of a fan-in semiconductor package before and after being packaged.

Figure 4:
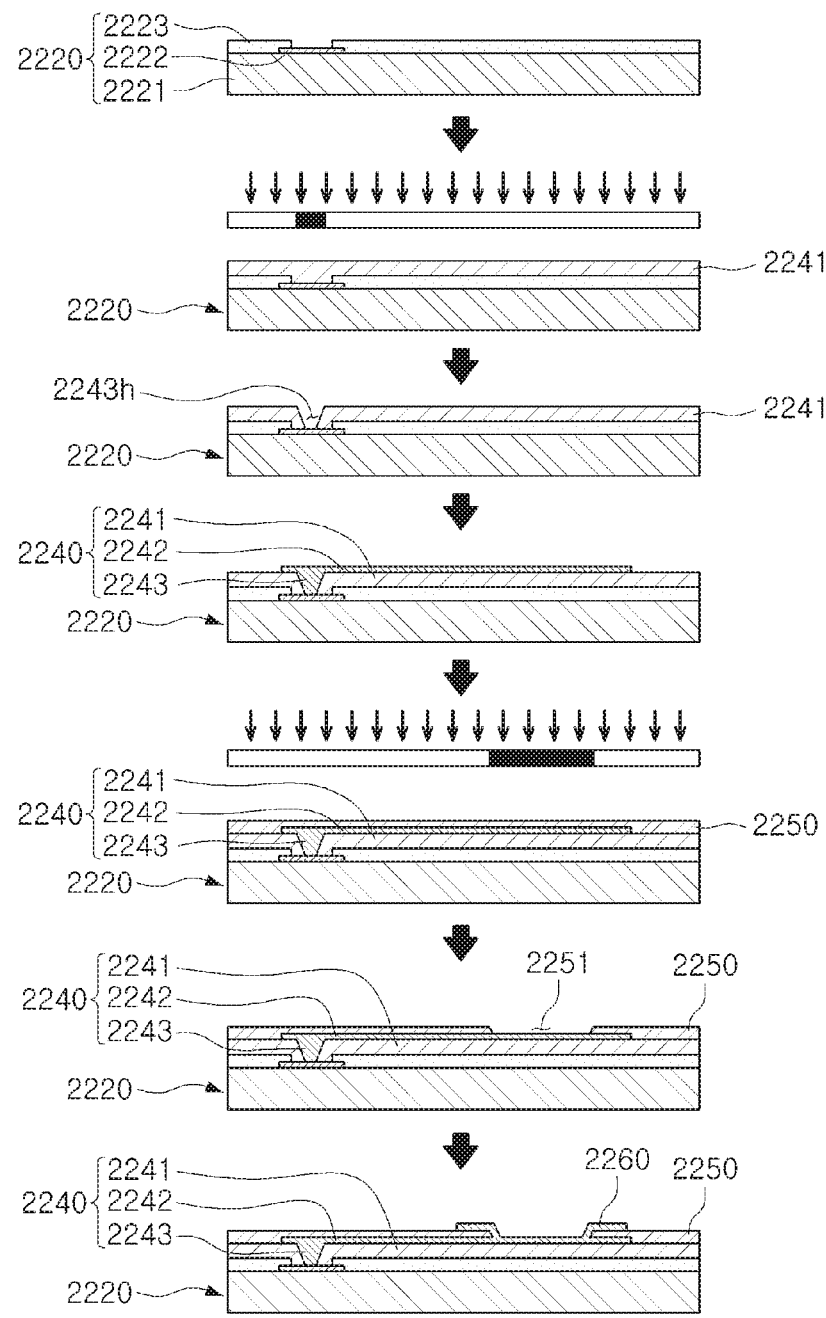
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photo imagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
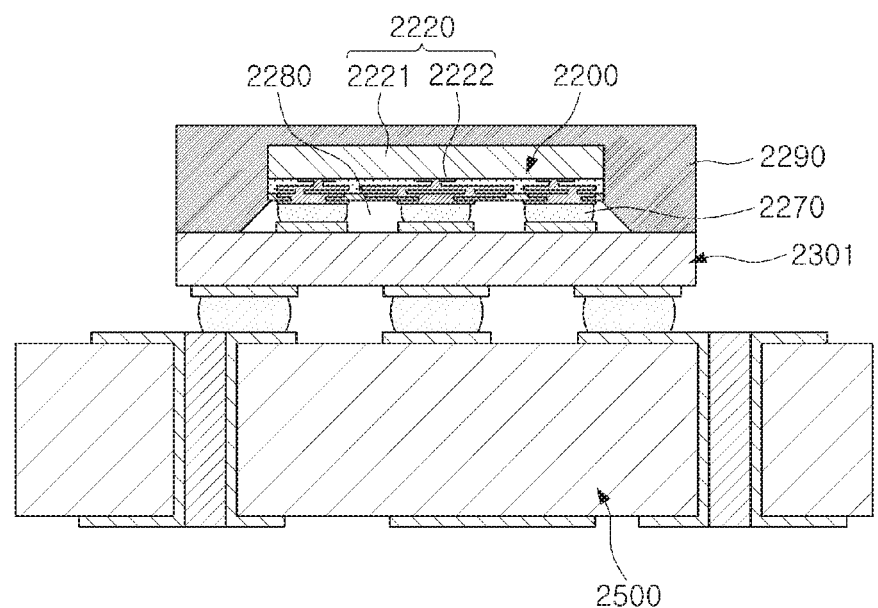
FIG. 5 is a schematic cross-sectional view illustrating a case in which a fan-in semiconductor package is mounted on a BGA substrate and is ultimately mounted on a main board of an electronic device.

FIG. 5 is a schematic cross-sectional view illustrating a case in which a fan-in semiconductor package is mounted on a BGA substrate and is ultimately mounted on a main board of an electronic device.

Figure 6:
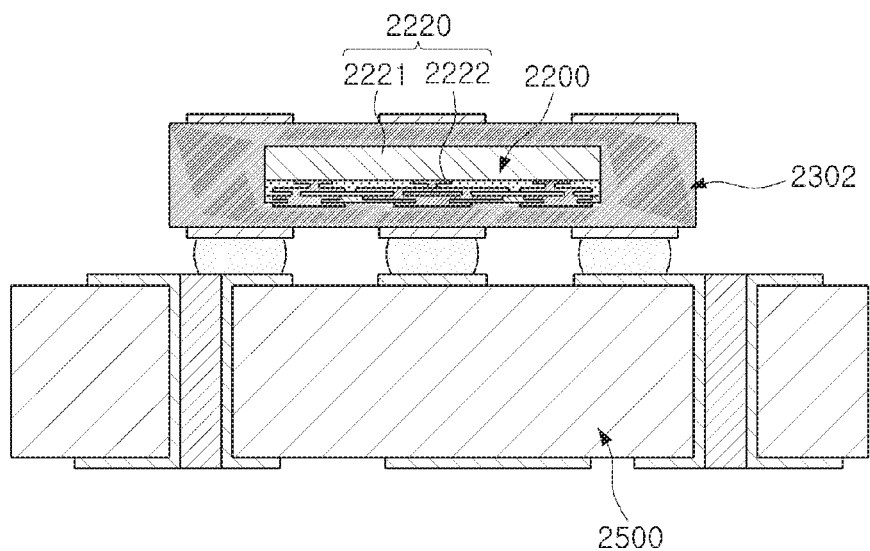
FIG. 6 is a schematic cross-sectional view illustrating a case in which a fan-in semiconductor package is embedded in a BGA substrate and is finally mounted on a main board of an electronic device.

FIG. 6 is a schematic cross-sectional view illustrating a case in which a fan-in semiconductor package is embedded in a BGA substrate and is finally mounted on a main board of an electronic device.

Referring to FIGS. 5 and 6, in a fan-in semiconductor package 2200, connection pads 2222, that is, I/O terminals, of a semiconductor chip 2220 may be redistributed through an BGA substrate 2301, and the fan-in semiconductor package 2200 may be finally mounted on a main board 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate BGA substrate and be then mounted on the main board of the electronic device through a packaging process or may be mounted and used on the main board of the electronic device in a state in which it is embedded in the BGA substrate.

Fan-out Semiconductor Package

Figure 7:
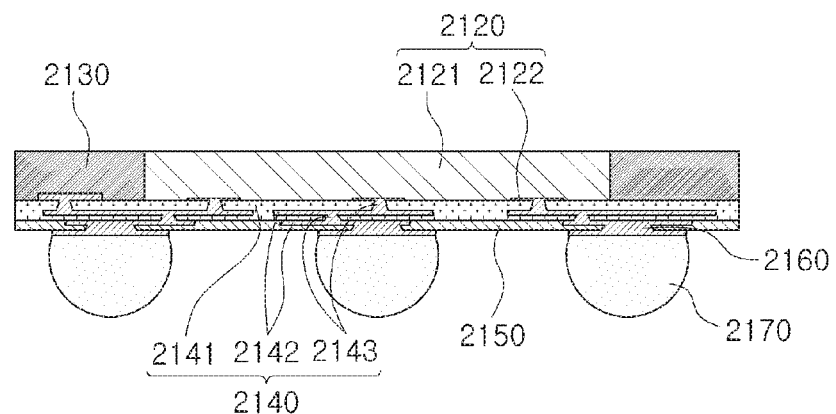
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may be further formed on the connection member 2140, and an underbump metal layer 2160 may be further formed in openings of the passivation layer 2202. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2241, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate BGA substrate, as described below.

Figure 8:
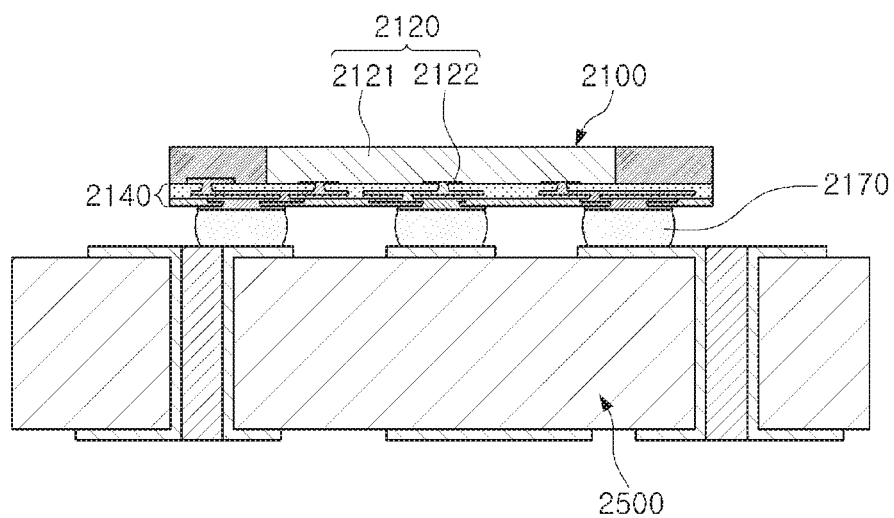
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate BGA substrate, or the like.

As described above, since the fan-out semiconductor package may be mounted on the main board of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as a BGA substrate or the like, having a scale, a purpose, and the like, different from those of the fan-out semiconductor package, and having the fan-in semiconductor package embedded therein.

A fan-out semiconductor package capable of simultaneously performing various functions, being thinned, and having low signal loss will hereinafter be described with reference to the drawings.

Figure 9:
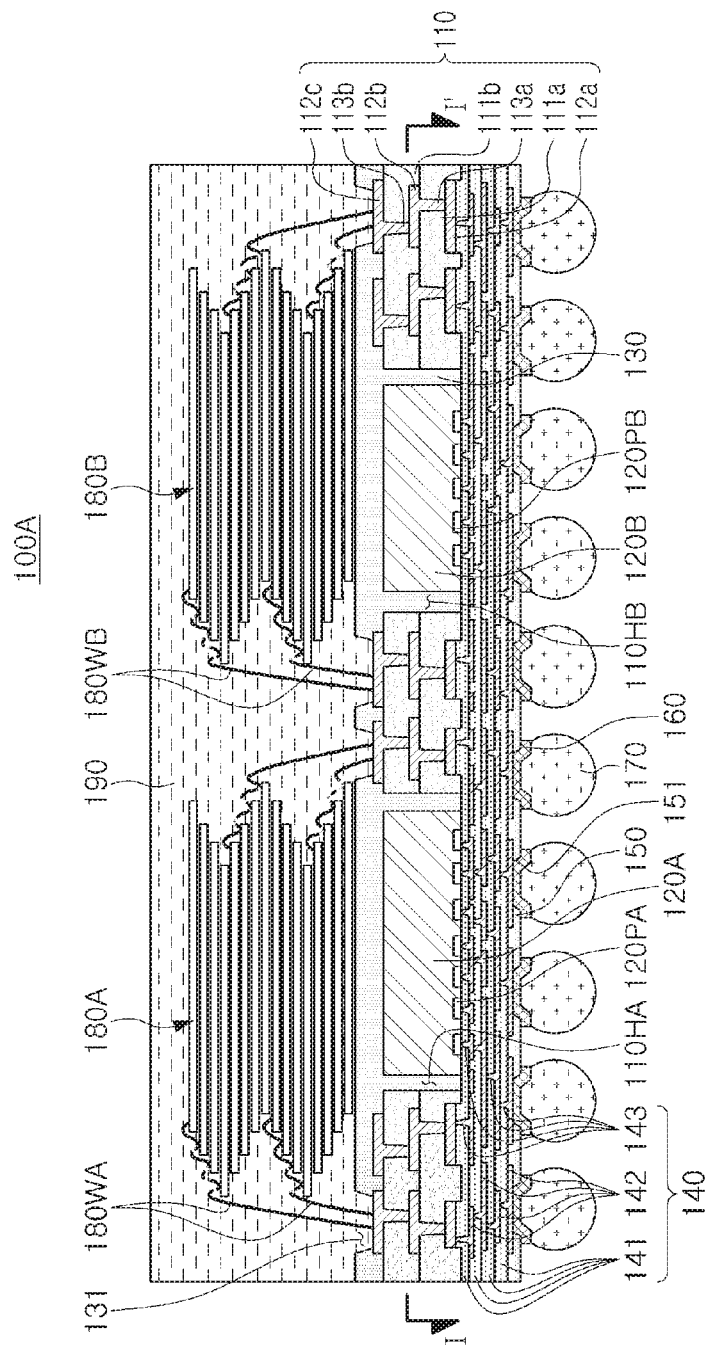
FIG. 9 is a schematic cross-sectional view illustrating an example of a fan-out semiconductor package.

FIG. 9 is a schematic cross-sectional view illustrating an example of a fan-out semiconductor package.

Figure 10:
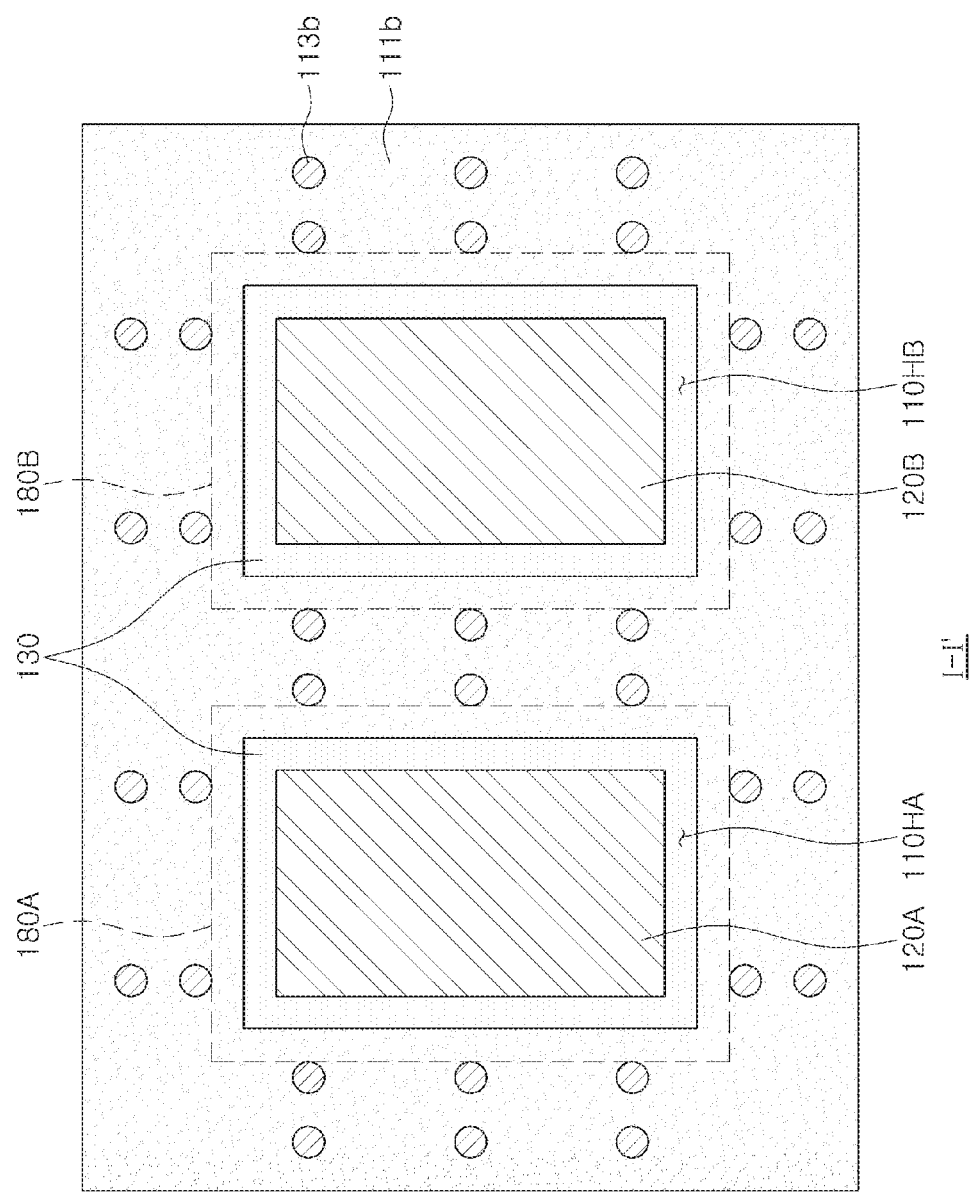
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment may include a core member 110 having a first through-hole 110HA and a second through-hole 110HB, spaced apart from each other and including one or more wiring layers 112a, 112b, and 112c, a first semiconductor chip 120A disposed in the first through-hole 110HA and having first connection pads 120PA formed on a lower side thereof, a second semiconductor chip 120B disposed in the second through-hole 110HB and having second connection pads 120PB formed on a lower side thereof, a first encapsulant 130 covering at least portions of the core member 110, the first semiconductor chip 120A, and the second semiconductor chip 120B, a connection member 140 disposed below the core member 110, the first semiconductor chip 120A, and the second semiconductor chip 120B, and including one or more redistribution layers 142, a first stack chip 180A disposed on the first encapsulant 130 and electrically connected to one or more wiring layers 112a, 112b, and 112c of the core member 110 through a first connection conductor 180WA, a second stack chip 180B disposed on the first encapsulant 130 and electrically connected to one or more wiring layers 112a, 112b, and 112c of the core member 110 through a second connection conductor 180WB, and a second encapsulant 190 disposed on the first encapsulant 130 and covering at least portions of the first stack chip 180A and the second stack chip 180B. In addition, the fan-out semiconductor package 100A may include a passivation layer 150 disposed below the connection member 140 and having an opening 151 that exposes at least a portion of the lowest redistribution layer of the redistribution layers 142 of the connection member 140, a plurality of underbump metal portions 160 disposed on the opening 151 of the passivation layer 150 and connected to the exposed lowest redistribution layer, and a plurality of electrical connection structures 170 disposed below the passivation layer 150 and connected to the plurality of underbump metal portions 160. The first connection pads 120PA and the second connection pads 120PB may be electrically connected to one or more wiring layers 112a, 112b, and 112c of the core member 110, respectively, through one or more redistribution layers 142 of the connection member 140. The first semiconductor chip 120A may include DRAM, the second semiconductor chip 120B may include a controller, and each of the first and second stack chips 180A and 180B may include a stack type NAND flash.

In general, SSD may be implemented as a package-on-package type package manufactured by mounting DRAM and/or the controller on a first interposer substrate to form a lower package, mounting the NAND flash on a second interposer substrate to form an upper package, and connecting the upper and lower packages to each other using solder balls and the like. However, in this case, since the interposer substrate is basically used, a thickness of the package is considerable. In particular, since the lower package and the upper package are separately manufactured and are then stacked to form an overall package, there is a limit to reduce the overall thickness of the package. In addition, since a signal distance between the lower package and the upper package is considerable, loss in characteristics may occur.

On the other hand, in the fan-out semiconductor package 100A according to an exemplary embodiment, the first and second semiconductor chips 120A and 120B that are applicable as DRAM and/or the controller may be encapsulated with the first encapsulant 130 together with the core member 110 having one or more wiring layers 112a, 112b, and 112c, the first and second stack chips 180A and 180B that are applicable as the NAND flashes may be directly mounted on an upper surface of the first encapsulant 130 without using the interposer, and the first and second stack chips 180A and 180B may be electrically connected to the wiring layers 112a, 112b, and 112c of the core member 110 using the connection conductors 180WA and 180WB such as bonding wires. Therefore, the thickness of the overall package 100A may be significantly reduced and signal transfer paths between the first and second semiconductor chips 120A and 120B and the first and second stack chips 180A and 180B may be significantly reduced by the reduced thickness. As a result, loss in signal characteristics may be significantly reduced. That is, according to an exemplary embodiment, the fan-out semiconductor package 100A capable of simultaneously performing various functions, being thinned, and having low signal loss may be provided, which may be usefully applied to a product such as SSD.

The respective components included in the fan-out semiconductor package 100A according to the exemplary embodiment will hereinafter be described in more detail.

The core member 110 may include one or more wiring layers 112a, 112b, and 112c that redistribute the connection pads 120PA and 120PB of the first and second semiconductor chips 120A and 120B and/or connection pads (not shown) of the first and second stack chips 180A and 180B. Therefore, the number of layers of the connection member 140 may be reduced. In addition, the core member 110 may maintain rigidity of the fan-out semiconductor package 100A depending on certain materials of an insulating layer of the core member 110, and serve to secure uniformity of a thickness of the first encapsulant 130. Upper and lower portions of the fan-out semiconductor package 100A according to the exemplary embodiment may be electrically connected to each other by the core member 110. The core member 110 may have the first and second through-holes 110HA and 110HB, spaced apart from each other. The first and second semiconductor chips 120A and 120B may be disposed in the first and second through-holes 110HA and 110HB so as be spaced apart from the core member 110 by a predetermined distance. Side surfaces of the first and second semiconductor chips 120A and 120B may be surrounded by the core member 110. However, such a form is only an example and may be variously modified to have other forms, and the core member 110 may perform another function depending on such a form.

The core member 110 may include a first insulating layer 111a in contact with the connection member 140, a first wiring layer 112a in contact with the connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. In addition, the core member 110 may include first connection via layers 113a penetrating through the first insulating layer 111a and electrically connecting the first and second wiring layers 112a and 112b to each other, and second connection via layers 113b penetrating through the second insulating layer 111b and electrically connecting the second and third wiring layers 112b and 112c to each other. When the first wiring layer 112a is embedded in the first insulating layer 111a, a step generated due to a thickness of the first wiring layer 112a may be significantly reduced, and an insulating distance of the connection member 140 may thus become constant. Therefore, a high density wiring design of the connection member 140 may be easy. A lower surface of the first wiring layer 112a and a lower surface of the first insulating layer 111a may have steps therebetween. In this case, the first insulating layer 111a may prevent the first encapsulant 130 from bleeding into the lower surface of the first wiring layer 112a to thereby solve a defective problem.

A material of each of the first and second insulating layers 111a and 111b is not particularly limited. For example, an insulating material may be used as the material of the first and second insulating layers 111a and 111b. In this case, the insulating material may be a thermosetting resin such as an epoxy resin, a thermoplastic resin such as a polyimide resin, an insulating material including the thermosetting resin and the thermoplastic resin, and a core material such as an inorganic filler and/or a glass cloth (or a glass fabric), for example, prepreg, Ajinomoto Build up Film (ABF), FR-4, Bismaleimide Triazine (BT), or the like. As the material of the first and second insulating layers 111a and 111b, ABF may be used.

The first to third wiring layers 112a, 112b, and 112c may serve to redistribute the connection pads 120PA and 120PB of the first and second semiconductor chips 120A and 120B and/or connection pads (not shown) of the first and second stack chips 180A and 180B, and may serve to provide pad patterns for connection via layers 113a and 113b to connect the upper and lower portions of the package 100A to each other. A material of each of the wring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The first to third wiring layers 112a, 112b, and 112c may perform various functions depending on designs of the corresponding layers. For example, the first to third wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring layers 112a, 112b, and 112c may include via pads, wire pads, electrical connection structure pads, and the like. For example, the third wiring layer 112c disposed on the uppermost portion may include the pad patterns connected to the first and second connection conductors 180WA and 180WB of the first and second stack chips 180A and 180B, and in a case in which the first and second connection conductors 180WA and 180WB are bonding wires, the pad patterns of the third wiring layer 112c may be wire pads. At this time, at least portions of the wire pads of the third wiring layer 112c may be exposed through the opening 131 formed in the first encapsulant 130, and the exposed portions may be connected to the bonding wires described above. Meanwhile, a surface treatment layer (not shown) may be formed on a surface of the wire pad of the exposed third wiring layer 112c, if necessary. The surface treatment layer (not shown) is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The first and second connection via layers 113a and 113b may electrically connect the wiring layers 112a, 112b, and 112c formed on different layers to each other, resulting in an electrical path in the core member 110. A material of each of the first and second connection via layers 113a and 113b may be a conductive material. The connection vias of each of the first and second connection via layers 113a and 113b may be completely filled with a conductive material, or a conductive material may also be formed along a wall of each of via holes. In addition, each of the connection vias may have a tapered shape. Meanwhile, when a via hole for the first connection via layer 113a is formed, a portion of the pad pattern of the first wiring layer 112a may serve as a stopper. Therefore, the first connection via layer 113a may have a tapered shape in which a width of an upper surface thereof is larger than that of a lower surface thereof in terms of the process. In this case, the first connection via layer 113a may be integrated with the pad patterns of the second wiring layer 112b. Similarly, the second connection via layer 113b may also have a tapered shape in which a width of an upper surface thereof is larger than that of a lower surface thereof in terms of the process. In this case, the second connection via layer 113b may be integrated with the pad patterns of the third wiring layer 112c.

The first semiconductor chip 121A may be an integrated circuit (IC) provided in an amount of several hundreds to several millions of elements or more integrated in a single chip. In this case, the integrated circuit constituting the first semiconductor chip 120A may be, for example, a volatile memory such as DRAM. The first semiconductor chip 120A may be formed on the basis of an active wafer. In this case, a base material of a body may be silicon (Si), germanium (Ge), gallium arsenide (GaAs), or the like. Various circuits may be formed on the body. The first connection pads 120PA may electrically connect the first semiconductor chip 120A to other components, and a conductive material such as aluminum (Al), or the like, may be used without any particular limitation as a material of each of the first connection pads 120PA. A surface on which the first connection pads 120PA are disposed may be an active surface, and an opposing surface may be an inactive surface. A passivation layer (not shown) exposing the first connection pads 120PA may be formed on the body, and may be an oxide film, a nitride film, or the like, or a double layer of an oxide layer and a nitride layer. An insulating film (not shown) or the like may be further disposed on other necessary positions, and a redistribution layer (not shown) may also be formed on the active surface.

The second semiconductor chip 120B may also be an integrated circuit (IC) provided in an amount of several hundreds to several millions of elements or more integrated in a single chip. At this time, the integrated circuit constituting the second semiconductor chip 120B may be, for example, a controller. The second semiconductor chip 120B may also be formed on the basis of an active wafer. The details are as described above. If necessary, the core member 110 may have only the first through-hole 110HA, only the first semiconductor chip 120A or the second semiconductor chip 120B may be disposed in the first through-hole 110HA, and the first and second semiconductor chips 120A and 120B may also be simultaneously disposed in the first through-hole 110HA.

The first encapsulant 130 may protect the core member 110, the first semiconductor chip 120A, the second semiconductor chip 120B, and the like. An encapsulation form of the first encapsulant 130 is not particularly limited, but may be a form in which the first encapsulant 130 surrounds at least portions of the core member 110, the first semiconductor chip 120A, the second semiconductor chip 120B, and the like. For example, the first encapsulant 130 may cover the core member 110, the first semiconductor chip 120A, the second semiconductor chip 120B, and may fill at least a portion of each of the first and second through-holes 110HA and 110HB. The certain materials of the first encapsulant 130 are not particularly limited. For example, an insulating material may be used as the certain materials of the first encapsulant 130. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. Alternatively, epoxy molding compound (EMC), PID, or the like, may be used as the insulating material. Alternatively, a prepreg in which a thermosetting resin or a thermoplastic resin is impregnated together with an inorganic filler in a core material such as a glass cloth (or a glass fabric) may also be used as the insulating material.

The connection member 140 may redistribute the first and second connection pads 120PA and 120PB of the first and second semiconductor chips 120A and 120B and/or the connection pads (not shown) of the first and second stack chips 180A and 180B, and may electrically connect them to each other. Several tens to several millions of connection pads 122 having various functions may be redistributed by the connection member 140, and may be physically and/or electrically externally connected through the electrical connection structures 170 depending on the functions. The connection member 140 may include insulating layers 141, redistribution layers 142 disposed on the insulating layers 141, and connection vias 143 penetrating through the insulating layers 141 and connecting the redistribution layers 142 to each other. In the fan-out semiconductor package 100A according to the exemplary embodiment, the connection member 140 may include a plurality of layer, but may also include a single layer.

A material of each of the insulating layers 141 may be an insulating material. In this case, a photosensitive insulating material such as a PID resin may also be used as the insulating material other than the insulating materials as described above. That is, the insulating layer 141 may be a photosensitive insulating layer. When the insulating layers 141 have photosensitive properties, the insulating layers 141 may be formed to have a smaller thickness, and a fine pitch of the connection vias 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on designs of a corresponding layer. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, electrical connection structure pads, and the like. A surface treatment layer (not shown) may be formed on surfaces of some redistribution layers 142 exposed by the opening 151 of the passivation layer 150, if necessary. The surface treatment layer (not shown) may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto. Meanwhile, thicknesses of the wiring layers 112a, 112b, and 112c of the core member 110 may be greater than those of the redistribution layers 142 of the connection member 140. Since the core member 110 may have a thickness equal to or greater than those of the first and second semiconductor chips 120A and 120B, the wiring layers 112a, 112b, and 112c formed on the core member 110 may also be formed at large sizes depending on a scale of the core member 110. On the other hand, the redistribution layers 142 of the connection member 140 may be formed at sizes relatively smaller than those of the wiring layers 112a, 112b, and 112c of the core member 110 for thinness of the connection member 140.

The connection vias 143 may electrically connect the redistribution layers 142, the connection pads 120PA and 120PB, or the like, formed on different layers to each other, resulting in an electrical path in the fan-out semiconductor package 100A. A material of each of the connection vias 143 may be a conductive material such as copper (Cu), aluminum (Al), silver (Ag), tin (Sn), gold (Au), nickel (Ni), lead (Pb), titanium (Ti), or alloys thereof. Each of the connection vias 143 may be completely filled with the conductive material, or the conductive material may also be formed along a wall of each of vias. In addition, the respective connection vias 143 may have a tapered shape in the same direction as each other.

The passivation layer 150 may be additionally configured to protect the connection member 140 from external physical or chemical damage. The passivation layer 150 may have openings 151 exposing at least portions of the lowest redistribution layer of the redistribution layers 142 of the connection member 140. The number of openings 151 formed in the passivation layer 150 may be several tens to several millions. A material having an elastic modulus greater than that of the insulating layer 141 of the connection member 140 may be used as a material of the passivation layer 150. For example, ABF that does not include a glass cloth (or a glass fabric), but includes an inorganic filler and an insulating resin, or the like, may be used as the material of the passivation layer 150. When the ABF, or the like, is used as the material of the passivation layer 150, a weight percent of the inorganic filler included in the passivation layer 150 may be greater than that of the inorganic filler included in the insulating layer 141 of the connection member 140. In this condition, reliability may be improved. When the ABF, or the like, is used as the material of the passivation layer 150, the passivation layer 150 may be a non-photosensitive insulating layer including the inorganic filler, and may be effective in improving reliability, but is not limited thereto.

The underbump metal portions 160 may have additional configurations and improve connection reliability of the electrical connection structures 170 to improve board level reliability of the fan-out semiconductor package 100A. The underbump metal layers 160 may be connected to the redistribution layers 142 of the connection member 140 exposed through the openings 151 of the passivation layer 150. The underbump metal layers 160 may be formed in the openings 151 of the passivation layer 150 by the known metallization method using the known conductive metal such as a metal, but are not limited thereto.

The electrical connection structures 170 may be additionally configured to physically and/or electrically externally connect the fan-out semiconductor package 100A. For example, the fan-out semiconductor package 100A may be mounted on the main board of the electronic device through the electrical connection structures 170. Each of the electrical connection structures 170 may be formed of a low melting point metal, for example, tin (Sn) or an alloy material including tin (Sn), more specifically, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several millions according to the number of connection pads, or may be provided in an amount of several tens to several millions or more or several tens to several thousands or less. When the electrical connection structures 170 are solder balls, the electrical connection structures 170 may cover side surfaces of the underbump metal portions 160 extending onto a lower surface of the passivation layer 150, and connection reliability may be more excellent. At least one of the electrical connection structures 170 may be disposed in a fan-out region. The fan-out region is a region except for the region in which the first semiconductor chip 120A is disposed. The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the fan-out package may be manufactured to have a small thickness, and may have price competitiveness.

Each of the first and second stack chips 180A and 180B may be implemented by stacking a plurality of integrated circuits in 3D. At this time, the integrated circuit constituting each of the first and second stack chips 180A and 180B may be a flash memory. More specifically, each of the first and second stack chips 180A and 180B may be a stack type NAND flash of a 3D shape. The connection pads (not shown) of the respective stacked memories of the first and second stack chips 180A and 180B may be connected the pad patterns of the third wiring layer 113c of the core member 110 through the connection conductors 180WA and 180WB, may be electrically connected to the redistribution layers 142 of the connection member 140 through the wiring layers 112a, 112b, and 112c of the core member 110, and may be electrically connected to the connection pads 120PA and 120PB of the first and second semiconductor chips 120A and 120B or the electrical connection structures 170. The connection conductors 180WA and 180WB may be known bonding wires such as metal wires. The first stack chip 180A may be disposed on the first semiconductor chip 120A and overlap with the first semiconductor chip 120A in a vertical direction along which the first stack chip 180A is stacked on the first semiconductor chip 120A, and the second stack chip 180B may be disposed on the second semiconductor chip 120B and overlap with the second semiconductor chip 120B in a vertical direction along which the second stack chip 180B is stacked on the second semiconductor chip 120B. At least one of the first connection pads 120PA of the first semiconductor chip 120A may be electrically connected to at least one of the electrical connection structures 170 through the redistribution layers 142 of the connection member 140, and the other thereof may be electrically connected to the first stack chip 180A through the redistribution layers 142 of the connection member 140 and the wiring layers 112a, 112b, and 112c of the core member 110. Similarly, at least one of the second connection pads 120PB of the second semiconductor chip 120B may be electrically connected to at least one of the electrical connection structures 170 through the redistribution layers 142 of the connection member 140, and the other thereof may be electrically connected to the second stack chip 180B through the redistribution layers 142 of the connection member 140 and the wiring layers 112a, 112b, and 112c of the core member 110.

The second encapsulant 190 may protect the first and second stack chips 180A and 180B. An encapsulation form of the second encapsulant 190 is not particularly limited, but may be a form in which the second encapsulant 190 surrounds at least portions of the first and second stack chips 180A and 180B. For example, the second encapsulant 190 may cover the first and second stack chips 180A and 180B so that the first and second stack chips 180A and 180B are completely embedded. The certain materials of the second encapsulant 190 are not particularly limited. For example, an insulating material may be used as the certain materials of the second encapsulant 190. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. In addition, as the insulating material, epoxy molding compound, PID, or the like may also be used, and a prepreg in which a thermosetting resin or a thermoplastic resin is impregnated together with an inorganic filler in a core material such as a glass cloth may also be used.

Meanwhile, although not illustrated in the drawings, separate passive components may be disposed to be in parallel together with the semiconductor chips 120A and 120B in the through-holes 110HA and 110HB. Alternatively, separate passive components may also be mounted on a lower surface of the passivation layer 150. In addition, metal layers may be disposed on walls of the through-holes 110HA and 110HB for electromagnetic shielding and heat radiation effect.

Figure 11:
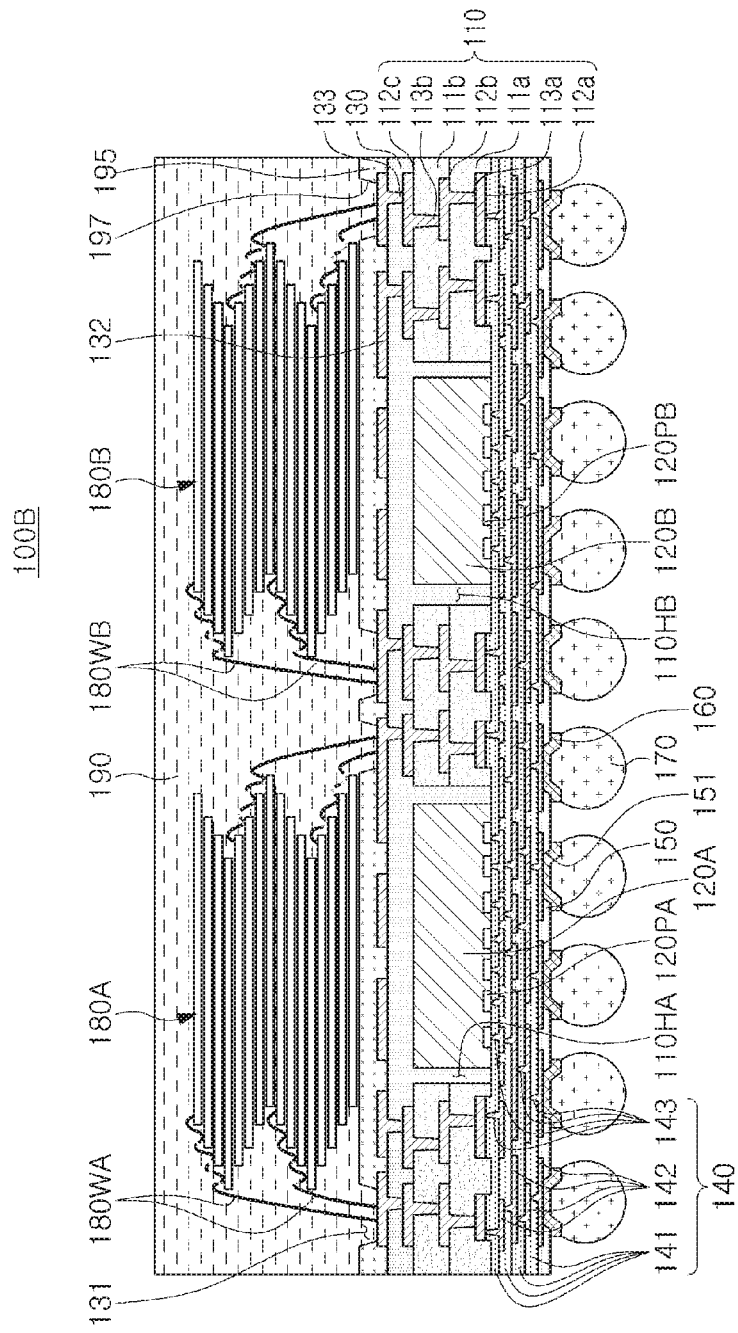
FIG. 11 is a schematic cross-sectional view illustrating another example of a fan-out semiconductor package.

FIG. 11 is a schematic cross-sectional view illustrating another example of a fan-out semiconductor package.

Referring to the drawing, a fan-out semiconductor package 100B according to another exemplary embodiment in the present disclosure may further include a backside redistribution layer 132 disposed on the first encapsulant 130, backside vias 133 penetrating through at least a portion of the first encapsulant 130 and electrically connecting the backside redistribution layer 132 and the redistribution layers 112c of the core member 110 to each other, and a cover layer 195 disposed on the first encapsulant 130 and covering at least portions of the backside redistribution layer 132. At this time, the first and second stack chips 180A and 180B may be disposed on the cover layer 195, and may be electrically connected to the backside redistribution layers 132 through the first and second connection conductors 180WA and 180WB, respectively. More specifically, each of the first and second stack chips 180A and 180B may be mounted on an upper surface of the cover layer 195, each of the first and second connection conductors 180WA and 180WB may include the bonding wire, the backside redistribution layer 132 may include a wire pad, the cover layer 195 may have an opening 197 exposing at least a portion of the wire pad, and the bonding wire may be connected to the exposed wire pad.

The backside redistribution layer 132 may serve to redistribute the connection pads 120PA and 120PB of the first and second semiconductor chip 120A and 120B and the connection pads (not shown) of the first and second stack chips 180A and 180B, and a conductive material such as copper (Cu), aluminum (Al), silver (Ag), tin (Sn), gold (Au), nickel (Ni), lead (Pb), titanium (Ti), or alloys thereof, may be used as a material of the backside redistribution layer 132. The backside redistribution layer 132 may perform various functions depending on a design. For example, the backside redistribution layer 132 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the backside redistribution layer 132 may include via pads, wire pads, electrical connection structure pads, and the like. Portions of the backside redistribution layer 132 may be exposed through the openings 197 formed in the cover layer 195, and the exposed backside redistribution layer 132 may be connected to the bonding wires as described above. That is, the exposed backside redistribution layer may include a wire pad connected to a wire. Meanwhile, a surface treatment layer (not shown) may be formed on a surface of the exposed backside redistribution layer 132, if necessary. The surface treatment layer (not shown) may be formed by, for example, electrolytic gold plating, electroless gold plating, OSP or electroless tin plating, electroless silver plating, electroless nickel plating/substituted gold plating, DIG plating, HASL, or the like.

The backside vias 133 may electrically connect the backside redistribution layer 132, the wiring layer 112c, and the like, formed on different layers to each other, resulting in an electrical path on the fan-out semiconductor package 100B. A material of the backside via 133 may be a conductive material such as copper (Cu), aluminum (Al), silver (Ag), tin (Sn), gold (Au), nickel (Ni), lead (Pb), titanium (Ti), or alloys thereof. Each of the backside vias 133 may be completely filled with a conductive material, or the conductive material may be formed along a wall of each of the vias. In addition, the backside via 133 may have a tapered shape in a direction opposite to the connection via 143 of the connection member 140. Other contents overlap those described above, and a detailed description thereof is thus omitted.

Figure 12:
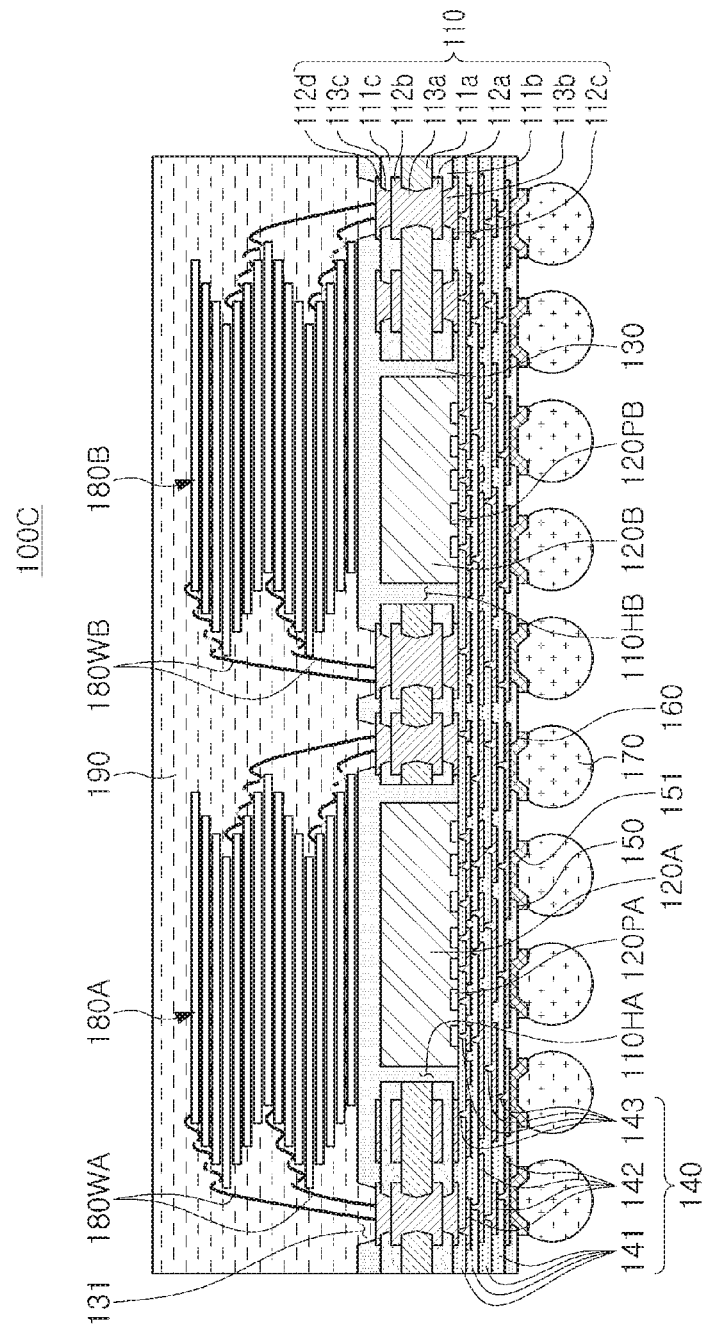
FIG. 12 is a schematic cross-sectional view illustrating another example of a fan-out semiconductor package.

FIG. 12 is a schematic cross-sectional view illustrating another example of a fan-out semiconductor package.

Figure 13:
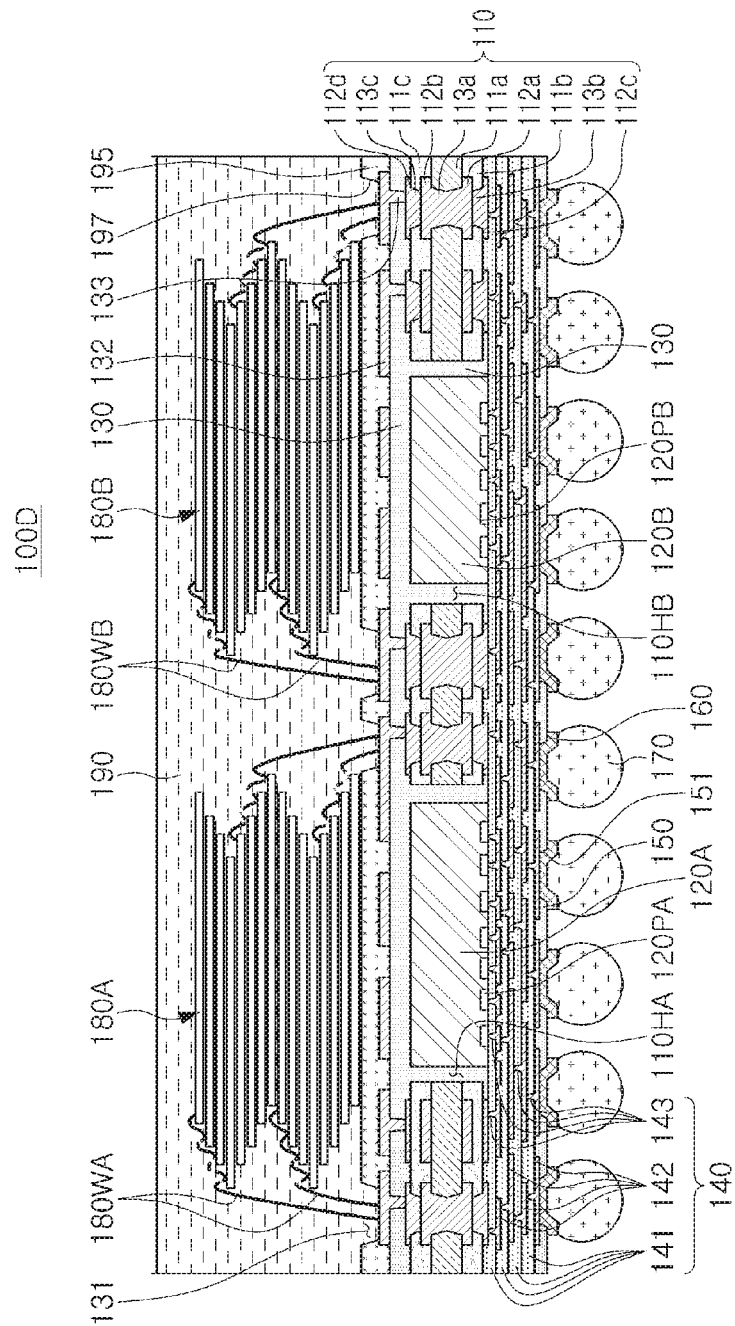
FIG. 13 is a schematic cross-sectional view illustrating another example of a fan-out semiconductor package.

FIG. 13 is a schematic cross-sectional view illustrating another example of a fan-out semiconductor package.

Referring to the drawings, in fan-out semiconductor packages 100C and 100D according to another exemplary embodiment in the present disclosure, a core member 110 may include a first insulating layer 111a, a first wiring layer 112a and a second wiring layer 112b disposed on opposite surfaces of the first insulating layer 111a, respectively, a second insulating layer 111b disposed on a lower surface of the first insulating layer 111a and covering the first wiring layer 112a, a third redistribution layer 111c disposed on a lower surface of the second insulating layer 111b, a third insulating layer 111c disposed on an upper surface of the first insulating layer 111a and covering the second wiring layer 112b, and a fourth wiring layer 112d disposed on an upper surface of the third insulating layer 111c, unlike the fan-out semiconductor packages 100A and 100B described above. Since the core member 110 may include a larger number of wiring layers 112a, 112b, 112c, and 112d, a connection member 140 may be further simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third connection via layers 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

The third wiring layer 112c of the core member 110 may be disposed in a protruding form on the second insulating layer 111b, resulting in being in contact with the connection member 140. The first wiring layer 112a and the second wiring layer 112b of the core member 110 may be disposed between an active surface and an inactive surface of the first semiconductor chip 120A. The core member 110 may be formed at a thickness corresponding to that of the first semiconductor chip 120. Therefore, the first wiring layer 112a and the second wiring layer 112b formed in the core member 110 may be disposed on the level between the active surface and the inactive surface of the first semiconductor chip 120. Thicknesses of the first to fourth wiring layers 112a, 112b, 112c, and 112d of the core member 110 may be greater than those of the redistribution layers 142 of the connection member 140. Since the core member 110 may have a thickness equal to or greater than that of the first semiconductor chip 120, the wiring layers 112a, 112b, 112c, and 112d may also be formed at larger sizes. On the other hand, the redistribution layers 142 of the connection member 140 may be formed at relatively small sizes for thinness. Other contents overlap those described above, and a detailed description thereof is thus omitted.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, the fan-out semiconductor package capable of simultaneously performing various functions, being thinned, and having low signal loss may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a core member having a first through-hole and including one or more wiring layers;
a first semiconductor chip disposed in the first through-hole and having first connection pads formed on a lower side of the first semiconductor chip;
a first encapsulant covering at least portions of the core member and the first semiconductor chip, and disposed in at least a portion of the first through-hole;
a connection member disposed below the core member and the first semiconductor chip and including one or more redistribution layers;
a first stack chip disposed on the first encapsulant and connected to the one or more wiring layers of the core member through a first connection conductor; and
a second encapsulant disposed on the first encapsulant and covering at least a portion of the first stack chip,
wherein the first semiconductor chip includes at least one of DRAM and a controller,
the first stack chip includes a stack type NAND flash,
the first connection pads of the first semiconductor chip are connected to the one or more wiring layers of the core member through the one or more redistribution layers of the connection member,
the first encapsulant extends continuously from an uppermost wiring layer of the one or more wiring layers to the portion of the first through-hole, and covers an upper side of the first semiconductor chip and a side surface of the first semiconductor chip which connects the upper and lower sides of the first semiconductor chip, the uppermost wiring layer of the one or more wiring layers has a lower surface in contact with an uppermost insulating layer of the core member, and has side surfaces extending from the lower surface and embedded in the first encapsulant, and the core member further includes:
  a first insulating layer,
  a first wiring layer and a second wiring layer disposed on opposite surfaces of the first insulating layer,
  a first connection via layer penetrating through the first insulating layer and connecting the first and second wiring layers to each other,
  a second insulating layer disposed on a lower surface of the first insulating layer and covering the first wiring layer,
  a third wiring layer disposed on a lower surface of the second insulating layer,
  a second connection via layer penetrating through the second insulating layer and connecting the first and third wiring layers to each other,
  a third insulating layer, as the uppermost insulating layer of the core member, disposed on an upper surface of the first insulating layer and covering the second wiring layer,
  a fourth wiring layer, as the uppermost wiring layer of the one or more wiring layers, disposed on an upper surface of the third insulating layer, and
  a fourth connection via layer penetrating through the third insulating layer and connecting the second and fourth wiring layers to each other.

2. The fan-out semiconductor package of claim 1, wherein the first stack chip is mounted on an upper surface of the first encapsulant,
  the first connection conductor includes a bonding wire,
  the uppermost wiring layer of the one or more wiring layers includes a wire pad,
  the first encapsulant has an opening exposing at least a portion of the wire pad, and
  the bonding wire is connected to the exposed wire pad.

3. The fan-out semiconductor package of claim 1, further comprising:
  a backside redistribution layer disposed on the first encapsulant;
  a backside via penetrating through at least a portion of the first encapsulant and connecting the backside redistribution layer and the uppermost wiring layer of the one or more wiring layers to each other; and
  a cover layer disposed on the first encapsulant and covering at least a portion of the backside redistribution layer,
  wherein the first stack chip is disposed on the cover layer and is connected to the backside redistribution layer through the first connection conductor.

4. The fan-out semiconductor package of claim 3, wherein the first stack chip is mounted on an upper surface of the cover layer,
  the first connection conductor includes a bonding wire,
  the backside redistribution layer includes a wire pad,
  the cover layer has an opening exposing at least a portion of the wire pad, and
  the bonding wire is connected to the exposed wire pad.

5. The fan-out semiconductor package of claim 1, wherein the core member further has a second through-hole spaced apart from the first through-hole,
  a second semiconductor chip having second connection pads is disposed in the second through-hole,
  a second stack chip connected to the one or more wiring layers of the core member through a second connection conductor is disposed on the first encapsulant,
  the first semiconductor chip includes DRAM,
  the second semiconductor chip includes a controller, and
  the second stack chip includes a stack type NAND flash.

6. The fan-out semiconductor package of claim 5, wherein the first stack chip overlaps with the first semiconductor chip in a stacking direction of the first stack chip and the first semiconductor chip,
  the second stack chip overlaps with the second semiconductor chip in a stacking direction of the second stack chip and the second semiconductor chip, and
  the first and second stack chips are disposed to be parallel to each other.

7. The fan-out semiconductor package of claim 1, wherein a thickness of the first insulating layer is greater than those of the second and third insulating layers.

8. The fan-out semiconductor package of claim 1, further comprising:
  a passivation layer disposed below the connection member and having openings exposing at least a portion of the lowest redistribution layer of the redistribution layers of the connection member;
  a plurality of underbump metal portions disposed on the openings of the passivation layer and connected to the exposed lowest redistribution layer; and
  a plurality of electrical connection structures disposed below the passivation layer and connected to the plurality of underbump metal portions.

9. The fan-out semiconductor package of claim 8, wherein at least one of the first connection pads of the first semiconductor chip is connected to at least one of the electrical connection structures through the redistribution layers of the connection member, and
  the other of the first connection pads of the first semiconductor chip is connected to the first stack chip through the one or more redistribution layers of the connection member and the one or more wiring layers of the core member.

10. The fan-out semiconductor package of claim 1, wherein the first through-hole penetrates through each insulating layer of the core member.

* * * * *